United States Patent
Abdo

(10) Patent No.: US 10,311,379 B1
(45) Date of Patent: *Jun. 4, 2019

(54) ISOLATION OF FREQUENCY MULTIPLEXED MICROWAVE SIGNALS USING CASCADING MULTI-PATH INTERFEROMETRIC JOSEPHSON ISOLATORS WITH NONOVERLAPPING BANDWIDTHS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/829,054

(22) Filed: Dec. 1, 2017

(51) Int. Cl.
*G06N 99/00* (2010.01)
*H04J 1/02* (2006.01)

(52) U.S. Cl.
CPC ............. *G06N 99/002* (2013.01); *H04J 1/02* (2013.01); *H04J 2203/00* (2013.01)

(58) Field of Classification Search
CPC ....... H04J 1/02; H04J 2203/00; G06N 99/002
USPC ......................................................... 398/82
See application file for complete search history.

(56) References Cited

U.S. PATENT DOCUMENTS

| 4,162,323 | A  |   | 7/1979  | Kahan |
|-----------|----|---|---------|-------|
| 6,374,093 | B1 |   | 4/2002  | Pesola |
| 6,486,756 | B2 | * | 11/2002 | Tarutani ................. H01L 27/18 257/E27.007 |
| 7,468,630 | B2 |   | 12/2008 | Inamdar et al. ......... 330/207 A |
| 7,557,600 | B2 |   | 6/2009  | Chong et al. .................... 326/1 |

(Continued)

FOREIGN PATENT DOCUMENTS

| JP | 2009194646 A | 8/2009 |
| KR | 100604396 B1 | 7/2006 |

(Continued)

OTHER PUBLICATIONS

Macklin, C. et al. (2015). A Near-Quantum-Limited Josephson Traveling-Wave Parametric Amplifier. Science 350.6258, 307-310.

(Continued)

*Primary Examiner* — Dalzid E Singh
(74) *Attorney, Agent, or Firm* — Garg Law Firm, PLLC; Grant Johnson

(57) ABSTRACT

A cascading microwave isolator (cascade) includes a set of Josephson devices, each Josephson device in the set having a corresponding operating bandwidth of microwave frequencies. Different operating bandwidths have different corresponding center frequencies. A series coupling is formed between first Josephson device from the set and an $n^{th}$ Josephson device from the set. The series coupling causes the first Josephson device to isolate a signal at a first frequency from a frequency multiplexed microwave signal (multiplexed signal) in a first signal flow direction through the series coupling and the $n^{th}$ Josephson device to isolate a signal at an $n^{th}$ frequency from the multiplexed signal in the first signal flow direction through the series.

20 Claims, 8 Drawing Sheets

(56) References Cited

U.S. PATENT DOCUMENTS

| | | | |
|---|---|---|---|
| 8,098,099 B2 | 1/2012 | Kao et al. | 330/260 |
| 9,130,508 B1 | 9/2015 | Kang et al. | |
| 9,455,707 B2* | 9/2016 | Herr | H03K 3/38 |
| 9,641,138 B2 | 5/2017 | Zhu | H03F 3/193 |
| 9,735,776 B1 | 8/2017 | Abdo | |
| 9,787,278 B1 | 10/2017 | Abdo | |
| 2004/0012407 A1* | 1/2004 | Amin | B82Y 10/00 326/3 |
| 2013/0214979 A1 | 8/2013 | McMillin et al. | |
| 2015/0119252 A1* | 4/2015 | Ladizinsky | B82Y 10/00 505/170 |
| 2016/0308502 A1 | 10/2016 | Abdo | |
| 2016/0380636 A1 | 12/2016 | Abdo | |
| 2017/0093381 A1 | 3/2017 | Abdo | |
| 2017/0104695 A1 | 4/2017 | Naaman | H04L 49/40 |

FOREIGN PATENT DOCUMENTS

| | | |
|---|---|---|
| WO | 03034542 A1 | 10/2002 |
| WO | 2015057839 A1 | 4/2015 |
| WO | 20150057839 A1 | 4/2015 |
| WO | 2016094045 A1 | 6/2016 |

OTHER PUBLICATIONS

Lecocq, F. et al. (2017). Nonreciprocal Microwave Signal Processing with a Field-Programmable Josephson Amplifier. Physical Review Applied 7.2: 024028.

Erickson, R. P. & Pappas, D. P. (2017). Theory of multiwave mixing within the superconducting kinetic-inductance traveling-wave amplifier. Physical Review B, 95(10). doi: http://dx.doi.org/10.1103/PhysRevB.95.104506.

Metelmann, A. & Clerk, A. A. (2015). Nonreciprocal photon transmission and amplification via reservoir engineering. Physical Review X, 5(2). doi: http://dx.doi.org/10.1103/PhysRevX.5.021025.

Abdo et al., PRL 112, 167701 (2014), Josephson Directional Amplifier for Quantum Measurement of Superconducting Circuits, Apr. 25, 2014, American Physical Society.

Abdo et al., (Oct. 10, 2017), Multi-Path Interferometric Josephson Directional Amplier for Qubit Readout.

Abdo et al., (Dated: Mar. 2, 2014), Supplemental Material for Josephson directional amplifier for quantum measurement of superconducting circuits.

Appendix P, 2017.

PCT, International Searching Authority, PCT/E P2018/050247, dated Jun. 8, 2018.

PCT, International Searching Authority, PCT/IB 2017/057987, dated Aug. 22, 2018.

PCT, International Searching Authority, PCT/E P2018/050247, dated Aug. 6, 2018.

PCT, International Searching Authority, PCT/E P2018/050244, dated Aug. 24, 2018.

PCT, International Searching Authority, PCT/E P2018/050245, dated Sep. 7, 2018.

PCT, International Searching Authority, PCT/EP2018/050251, dated Aug. 29, 2018.

PCT, International Searching Authority, PCT/EP2018/050246, dated Aug. 17, 2018.

PCT, Written Opinion of the International Searching Authority (Separate Sheet), PCT/EP2018/050253, 1SA/237, EPO—dated Apr. 2005.

Selective Switching of Frequency Multiplexed Microwave Signals Using Cascading Multi-Path Interferometric Josephson Switches With Nonoverlapping Bandwidths.

Frattini NE et al: '3-wave mixing Josephson dipole element', Applied Physics Letters, A I P Publishing LLC, US, vol. 110, No. 22, May 31, 2017 (May 31, 2017), XP012219271, ISSN: 0003-6951, DOI: 10.1063/1.4984142, retrieved on May 31, 2017.

Baleegh Abdo et al: "Directional Amplification with a Josephson Circuit", Physical Review X, vol. 3, No. 3, Jul. 1, 2013 (Jul. 1, 2013), XP055493386, DOI: 10.1103/PhysRevX.3.031001 A p. 2, left-hand column, paragraph 4 p. 3, left-hand column, paragraph 2; figure 1, p. 3, right-hand column, paragraph 3 p. 4, left-hand column, paragraph 1; figure 2.

Westig MP et al: "Josephson parametric reflection amplifier with integrated directionality", arxiv.org, Cornell University Library, 201 Olin Library Cornell University Ithaca, NY 14853, Jun. 28, 2017 (Jun. 28, 2017), XP080773209, p. 1, right-hand column, paragraph 2; figure 1.

Bergeal N et al: "Analog information processing at the quantum limit with a Josephson ring modulator", arxiv.org, Cornell University Library, 201 Olin Library Cornell University Ithaca, NY 14853, May 22, 2008 (May 22, 2008), XP080419198, DOI: 10.1038/NPHYS1516, p. 5-p. 15.

List of IBM's related patent applications, Appendix P, 2018.

* cited by examiner

ISOLATION OF FREQUENCY MULTIPLEXED MICROWAVE SIGNALS USING CASCADING MULTI-PATH INTERFEROMETRIC JOSEPHSON ISOLATORS WITH NONOVERLAPPING BANDWIDTHS

TECHNICAL FIELD

The present invention relates generally to a device, a fabrication method, and fabrication system for a frequency multiplexed microwave light isolator usable with superconducting qubits in quantum computing. More particularly, the present invention relates to a device, method, and system for isolation of frequency-multiplexed microwave signals using cascading multi-path interferometric Josephson isolators in nonoverlapping bandwidths, where the isolators are based on nondegenerate three-wave-mixing Josephson devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement.

Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the |0> and |1> states of the qubit. This operational constraint on any circuit that operates with quantum information necessitates special considerations in fabricating semiconductor and superconducting structures that are used in such circuits.

A microwave isolator is a device that allows microwave light waves to pass through it without significant amplitude attenuation (propagate) in one direction, and prohibits or significantly attenuates the microwave light waves when attempting to pass through it in the opposite direction. A reference herein to an "isolator" is a reference to a microwave isolator. In other words, the isolator operates as a directional gate for microwave light, meaning the response of the device is dependent on the direction in which the microwave light is propagating through the device. Isolators are used in quantum computing for guiding microwave signals into and out of the quantum processor in a specified flow direction.

A multi-path interferometric Josephson isolator based on nondegenerate three-wave-mixing Josephson devices is hereinafter compactly and interchangeably referred to as Multi-Path Interferometric Josephson ISolator (MPIJIS). An MPIJIS device can be implemented as a microwave isolator in a superconducting quantum circuit. The direction of isolation in an MPIJIS can be reversed in situ by negating the phase difference between the two pump tones driving the device.

A superconducting nondegenerate three-wave-mixing device can be used as part of the MPIJIS by operating the mixing device in a frequency conversion (no photon gain) mode. The nondegenerate three-wave mixer can be a Josephson parametric converter (JPC).

A superconducting nondegenerate three-wave mixer has 3 ports, which are Signal port (S) through which a microwave signal of frequency $f_S$ can be input, Idler port (I) through which an idler microwave signal of frequency $f_I$ can be input, and pump port (P) through which a microwave signal of frequency $f_P$ and phase $\varphi_p$ can be input. In one configuration (without loss of generality), $f_I$ is a high frequency, $f_P$ is a low frequency, and $f_S$ is a medium frequency, when $f_P$, $f_S$, and $f_I$ are compared relative to each other (i.e., $f_I > f_S > f_P$). The superconducting nondegenerate three-wave mixer is characterized as nondegenerate because it has two modes—namely S and I, which are both spatially and spectrally different.

From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_P$, where $f_P = f_I - f_S = f_2 - f_1$.

On resonance, the nondegenerate three-wave mixer (e.g., JPC) satisfies the following scattering matrix when operated in noiseless frequency conversion:

$$[S] = \begin{pmatrix} r & t \\ t' & r \end{pmatrix}$$

A nondegenerate three-wave mixer operates at a 50:50 Beam splitter working point where:

$$|r|^2 = \frac{1}{2}, |t|^2 = \frac{1}{2} \text{ and } [S] = \begin{pmatrix} \frac{1}{\sqrt{2}} & \frac{ie^{-i\varphi_P}}{\sqrt{2}} \\ \frac{ie^{i\varphi_P}}{\sqrt{2}} & \frac{1}{\sqrt{2}} \end{pmatrix}$$

This mode is dependent upon the pump amplitude which has to be set appropriately for this mode to become operational. The phase of the pump $\varphi_p$ (which are later denoted as $\varphi_1$ and $\varphi_2$ for two pump signals into two different nondegenerate three-wave mixers) will be utilized in accordance with the embodiments described herein. Phase $\varphi_p$ is added to the signal propagating from port S to port I, and phase $\varphi_p$ is subtracted from signal propagating from port I to port S.

Two suitable manifestations of the nondegenerate three-wave mixer, each operating in 50:50 beam splitting mode are used as one component in an MPIJIS according to the illustrative embodiments. JPC is one such non-limiting manifestation.

In quantum circuits, microwave signals can include more than one frequency. Generally, the microwave signals span a band of frequencies. An MPIJIS generally operates with a comparatively narrow band of frequencies around a central frequency for which the MPIJIS is tuned. The illustrative embodiments recognize that a new isolator design is needed that is capable of isolating all or some microwave signals having different, even if a frequency of a signal lies outside the operational frequency band of a single MPIJIS.

SUMMARY

The illustrative embodiments provide a superconducting device, and a method and system of fabrication therefor. A superconducting device of an embodiment forms a cascading microwave isolator (cascade), which includes a set of Josephson devices, each Josephson device in the set having a corresponding operating bandwidth of microwave frequencies, wherein different operating bandwidths have different corresponding center frequencies. The embodiment includes a series coupling between first Josephson device from the set and an $n^{th}$ Josephson device from the set, wherein the series coupling causes the first Josephson device to isolate a signal at a first frequency from a frequency multiplexed microwave signal (multiplexed signal) in a first signal flow direction through the series coupling and the $n^{th}$ Josephson device to isolate a signal at an $n^{th}$ frequency from the multiplexed signal in the first signal flow direction through the series.

Another embodiment further includes an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device isolates a signal at an $(n-1)^{th}$ frequency from the multiplexed signal in the first signal flow direction.

In another embodiment, the series coupling causes the first Josephson device to propagate the signal at an $n^{th}$ frequency from the multiplexed signal in the first signal flow direction through the series coupling and the $n^{th}$ Josephson device to propagate the signal at the first frequency in the first signal flow direction through the series.

In another embodiment, the series coupling causes the first Josephson device and the $n^{th}$ Josephson device to propagate all signals at frequencies from the multiplexed signal in a second signal flow direction through the series coupling, wherein the second signal flow direction is opposite of the first signal flow direction, and wherein the first signal flow direction is a direction of isolation of the first Josephson device and the $n^{th}$ Josephson device.

In another embodiment, a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

In another embodiment, a total isolation bandwidth of the cascade comprises the first operating bandwidth and the $n^{th}$ operating bandwidth.

In another embodiment, the first Josephson device in the set of Josephson devices is an MPIJIS includes a first nondegenerate microwave mixer device (first mixer); a second nondegenerate microwave mixer device (second mixer); a first input/output (I/O) port coupled to an input port of the first mixer and an input port of the second mixer; and a second I/O port coupled to the input port of the first mixer and the input port of the second mixer, wherein the signal of the first frequency communicated between the first I/O port and the second I/O port is transmitted while propagating in a first direction between the first I/O port to the second I/O port through the first mixer and the second mixer and is blocked while propagating in a second direction between the second I/O port to the first I/O through the first mixer and the second mixer, and wherein the first frequency is in a first operating bandwidth of the first Josephson device.

Another embodiment further includes a first microwave pump injecting a first microwave drive into the first mixer at a pump frequency and a first pump phase, wherein the first microwave pump is configured to cause the first mixer to operate at a 50:50 beamsplitting working point; and a second microwave pump injecting a second microwave drive into the second mixer at the pump frequency and a second pump phase wherein the second microwave pump is configured to cause the second mixer to operate at the 50:50 beamsplitting working point, and wherein a phase difference between the first pump phase and the second pump phase determines an isolation direction.

In another embodiment, the first mixer and the second mixer are each a nondegenerate three-wave mixer.

In another embodiment, the first mixer and the second mixer are each a Josephson parametric converter (JPC), and wherein the first mixer and the second mixer are nominally identical.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
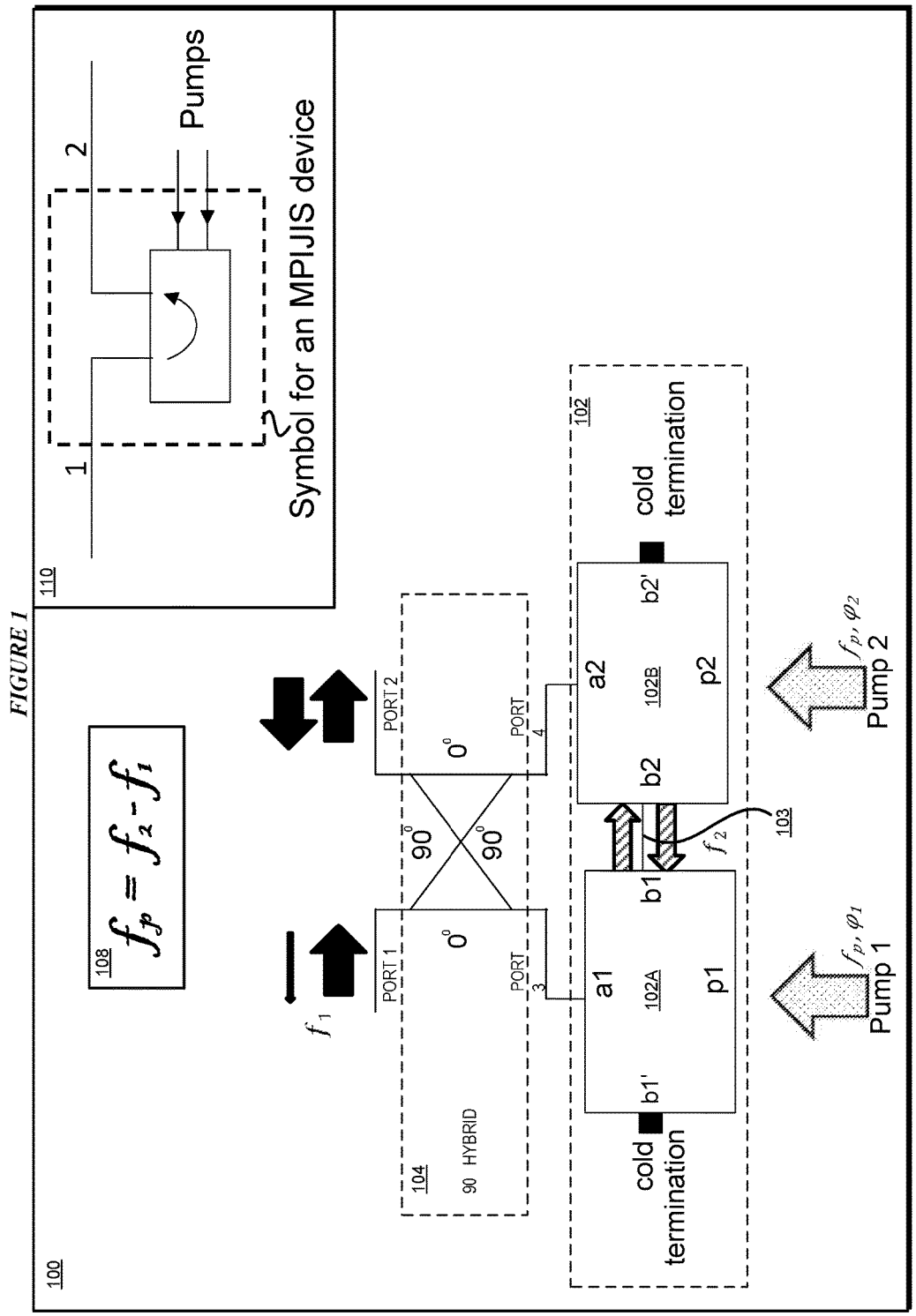
FIG. 1 depicts a block diagram of an example configuration of an MPIJIS that is usable in a cascade in accordance with an illustrative embodiment.

The illustrative embodiments used to describe the invention generally address and solve the above-described needs for isolation of some or all frequency-multiplexed microwave signals. The illustrative embodiments provide an isolator device comprising cascading multi-path interferometric Josephson isolators having nonoverlapping bandwidths, where the isolators are based on nondegenerate three-wave-mixing Josephson devices. Such a cascading isolator device is compactly referred to herein as a cascading MPIJIS.

An operation described herein as occurring with respect to a frequency of frequencies should be interpreted as occurring with respect to a signal of that frequency or frequencies. All references to a "signal" are references to a microwave signal unless expressly distinguished where used.

The term "frequency multiplexed signal" refers to a composite signal which includes multiple signals at various frequencies and is therefore not different from the term "frequency multiplexed signals", which refers to signals at various frequencies multiplexed together. The two terms are therefore used interchangeably to mean more than one signals of different frequencies multiplexed or presented together to a device or in an operation.

An embodiment provides a configuration of a cascading MPIJIS. Another embodiment provides a fabrication method for the cascading MPIJIS, such that the method can be implemented as a software application. The application implementing a fabrication method embodiment can be configured to operate in conjunction with an existing superconductor fabrication system—such as a lithography system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example mixers, hybrids, and other circuit components are used in the figures and the illustrative embodiments. In an actual fabrication or circuit, additional structures or component that are not shown or described herein, or structures or components different from those shown but for the purpose described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within a cascading MPIJIS, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of an MPIJIS that is usable in a cascade in accordance with an illustrative embodiment. MPIJIS configuration 100 comprises pair 102 of nondegenerate three-wave mixer 102A and nondegenerate three-wave mixer 102B. Each of nondegenerate three-wave mixer 102A and nondegenerate three-wave mixer 102B is operating at the beam splitter working point.

Nondegenerate three-wave mixer 102A is configured with physical ports a1 (corresponding to signal port S), b1 (corresponding to signal port I), p1 (corresponding to signal port P), and b1' (corresponding to signal port I). The pump frequency ($f_P$) is a difference between idler frequency ($f_2$) and input signal frequency ($f_1$) according to expression 108. Physical port b1' is terminated using a cold terminator. For example, the cold termination of port b1' may be a 50 Ohm termination.

Nondegenerate three-wave mixer 102B is configured with physical ports a2, b2, p2, and b2', pump frequency ($f_P$), and a cold terminator in a similar manner. Port b1 of mixer 102A and port b2 of mixer 102B are coupled together using transmission line 103.

Ports 1 and 2 of 90-degree hybrid 104 form ports 1 and 2, respectively, of MPIJIS 100, as described herein. Port a1 of nondegenerate three-wave mixer 102A is coupled with port 3 of hybrid 104. Port a1 of Nondegenerate three-wave mixer 102B is coupled with port 4 of hybrid 104.

Figure 2:
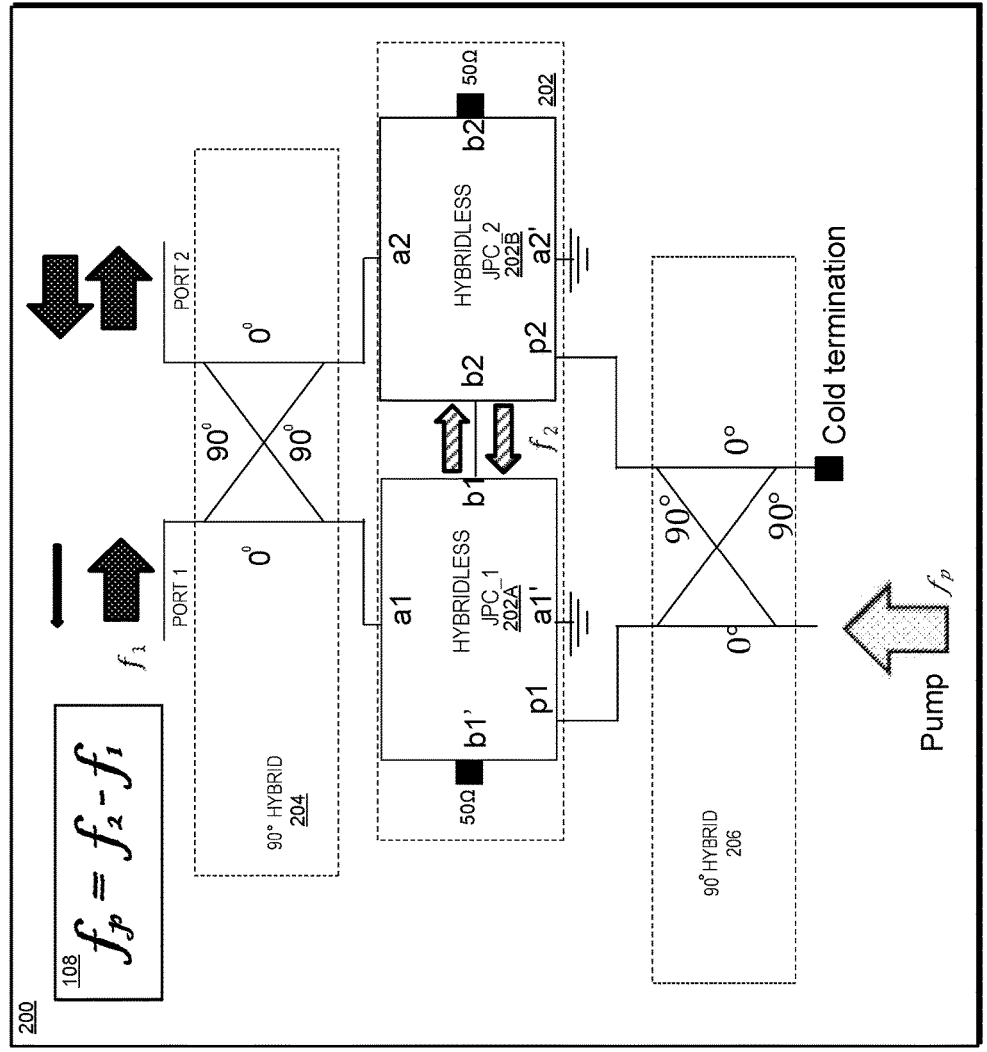
FIG. 2 depicts another alternate configuration for an MPIJIS that is usable in a cascade in accordance with an illustrative embodiment.

This configuration 100 of nondegenerate three-wave mixers 102A and 102B, and other possible similarly-purposed configurations using the described components, is compactly represented as symbol 110. For example, FIG. 2 depicts another possible similarly-purposed configuration using the described components. The rounded arrow inside the block of symbol 110 represents a non-isolating (propagating) direction of the signal from port 1 to port 2 in symbol 110. In other words, MPIJIS 110 isolates the signal from port 2 to port 1 but passes the signal from port 1 to port 2.

This series connection of the MPIJIS devices is not intuitive. In a normal series coupling of electrical or electronic elements, a parameter of the series is limited (e.g., the bandwidth of the series) by the weakest/smallest/lowest value of the parameter in the serial chain. The entire series of the elements operates at that weakest/smallest/lowest value. In contrast, the cascade of MPIJIS devices, due to the special properties of the MPIJIS devices used therein, out-of-band signals (a signal of a frequency that is not in the device's bandwidth) are not acted upon and allowed to simply pass through, and each device acts (isolates) only upon that part of the signal that lies in its own bandwidth, thus providing a non-intuitive additive span in the bandwidth.

With reference to FIG. 2, this figure depicts another alternate configuration for an MPIJIS that is usable in a cascade in accordance with an illustrative embodiment. Hybrid 204 is a 90-degree hybrid and is configured with hybrid-less JPC 202A and hybrid-less JPC 202B in a manner substantially as hybrid 104 is configured with nondegenerate three-wave mixers 102A and 102B in FIG. 1. Configuration 200 uses a single pump drive in conjunction with hybrid 206 to provide the pump input to hybrid-less JPC 202A and hybrid-less JPC 202B. Configuration 200 is also represented by symbol 110.

Figure 3:
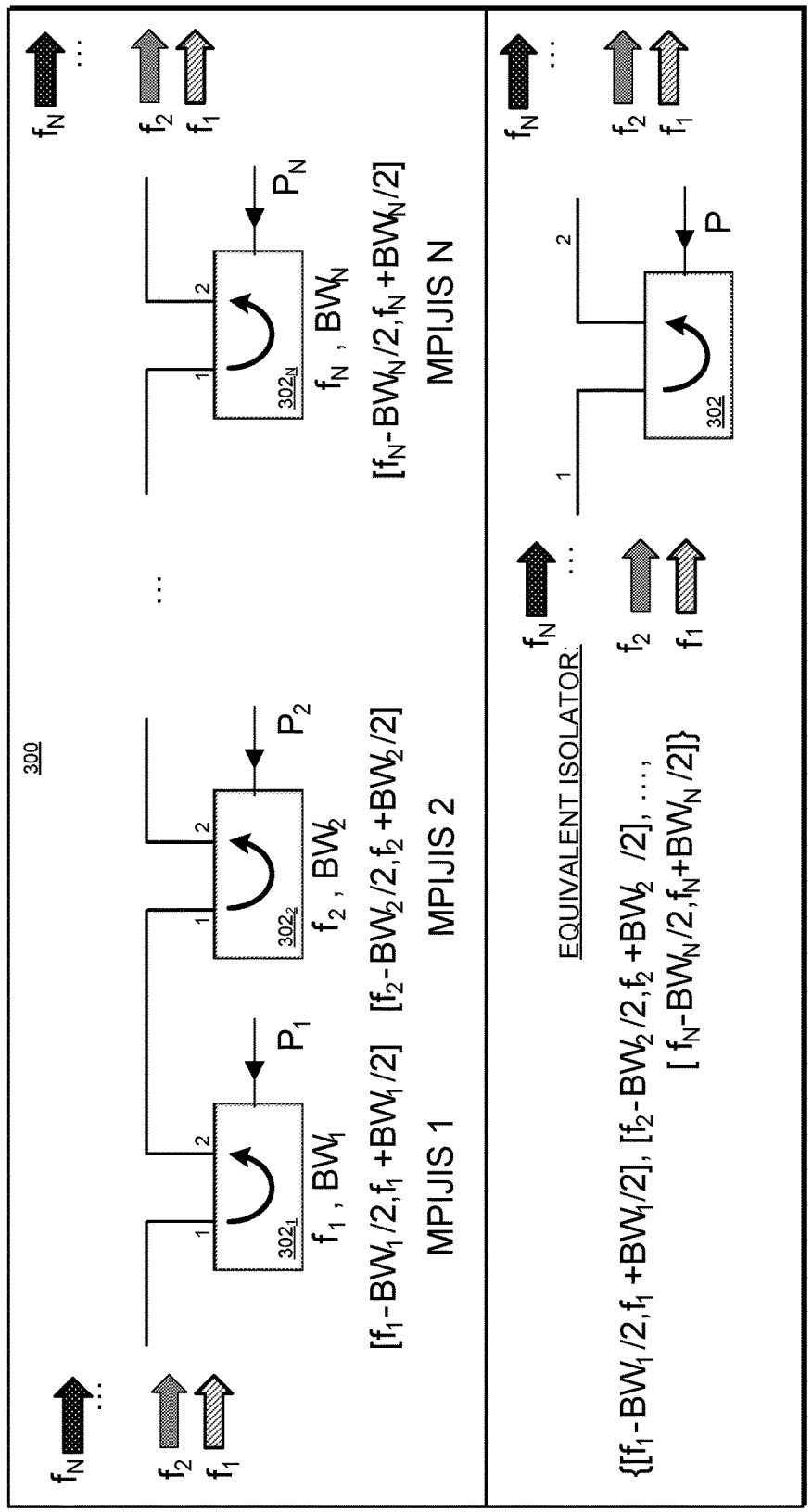
FIG. 3 depicts a block diagram of an example configuration and a non-isolating operation of a cascading MPIJIS in accordance with an illustrative embodiment.
Figure 4:
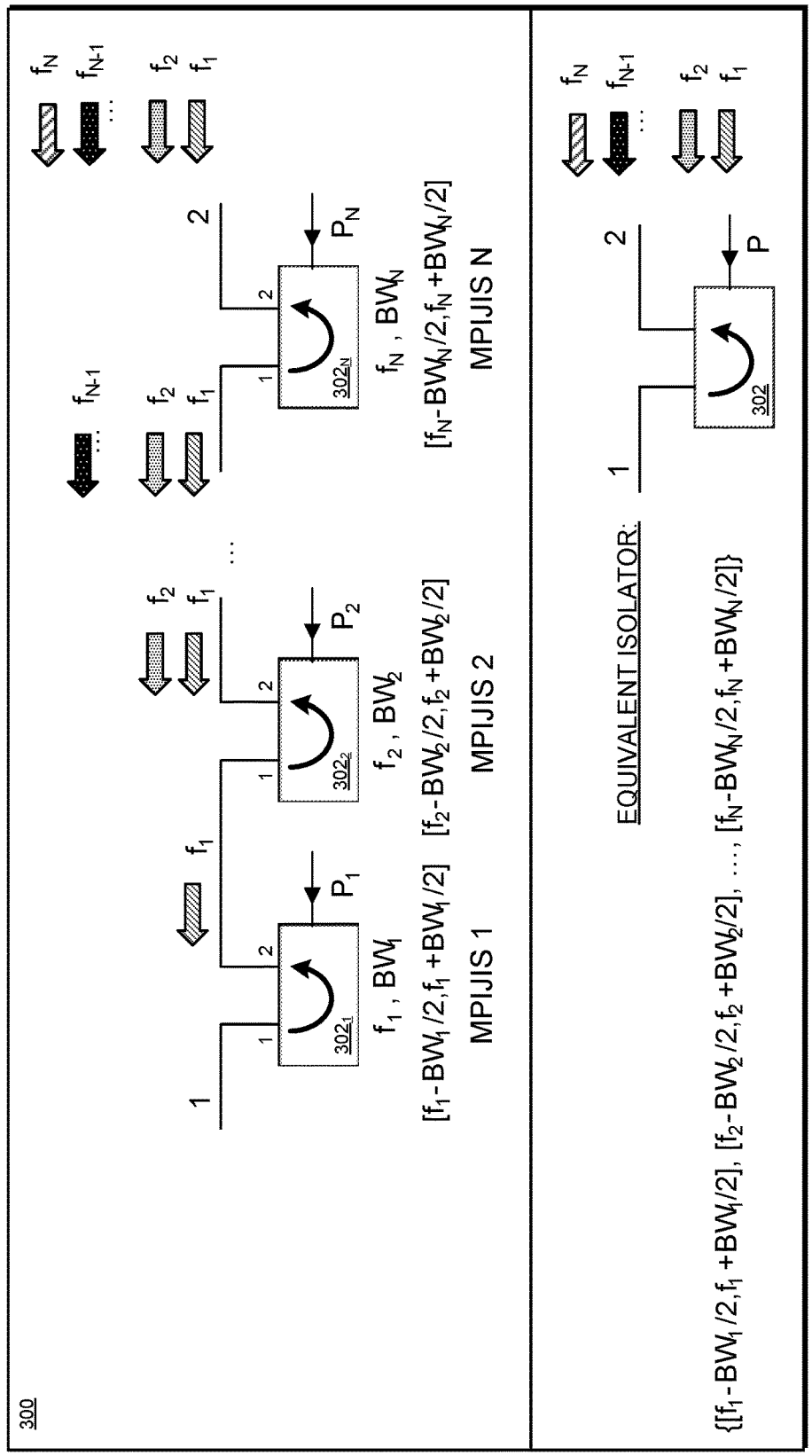
FIG. 4 depicts a block diagram of an example isolating operation of a cascading MPIJIS in accordance with an illustrative embodiment.
Figure 5:
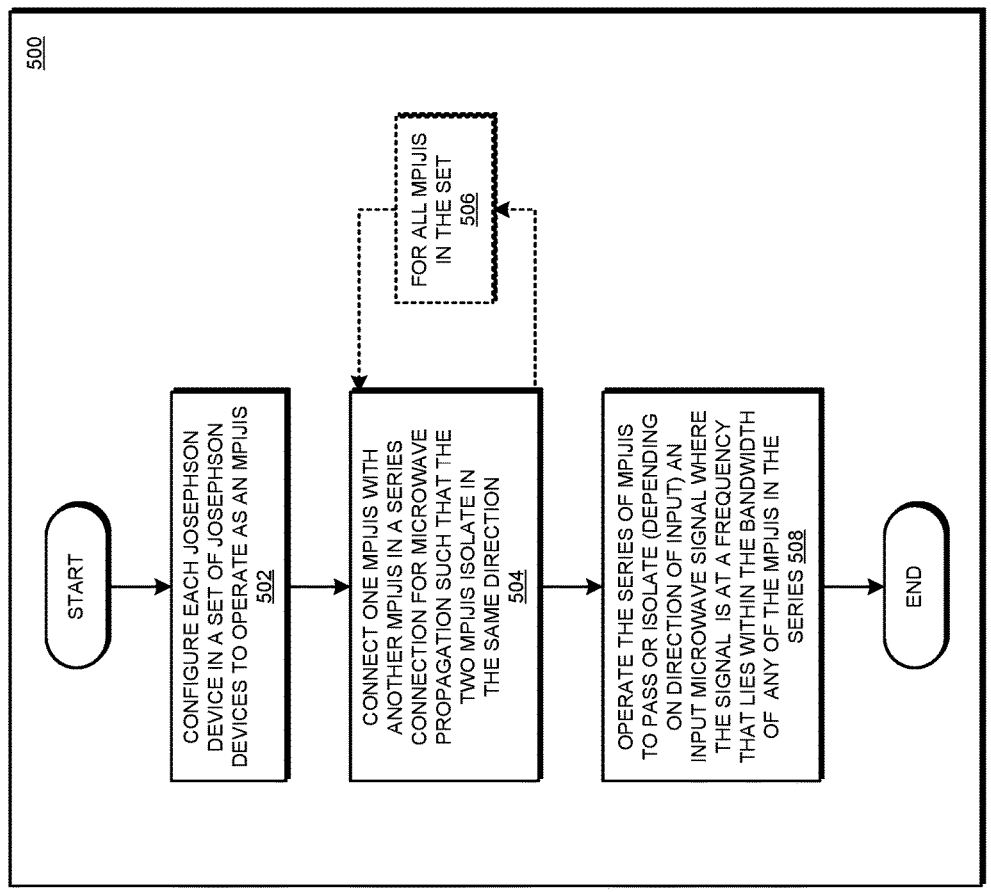
FIG. 5 depicts a flowchart of an example process for propagation or isolation of all signals at frequencies within a frequency multiplexed microwave input using cascading multi-path interferometric Josephson isolators with non-overlapping bandwidths in accordance with an illustrative embodiment.
Figure 6:
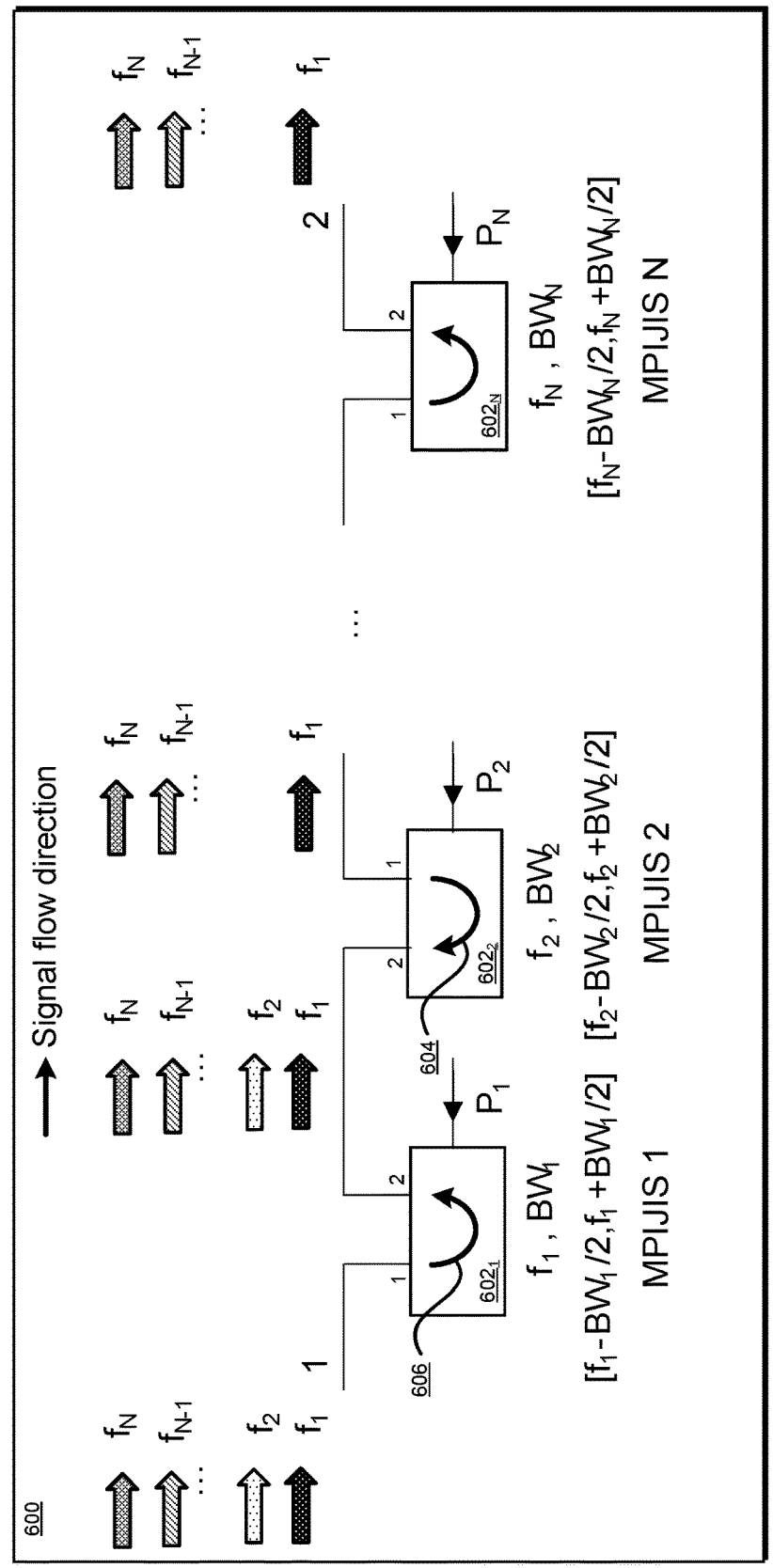
FIG. 6 depicts a block diagram of an example configuration and a selective isolation operation of a cascading MPIJIS in accordance with an illustrative embodiment.
Figure 7:
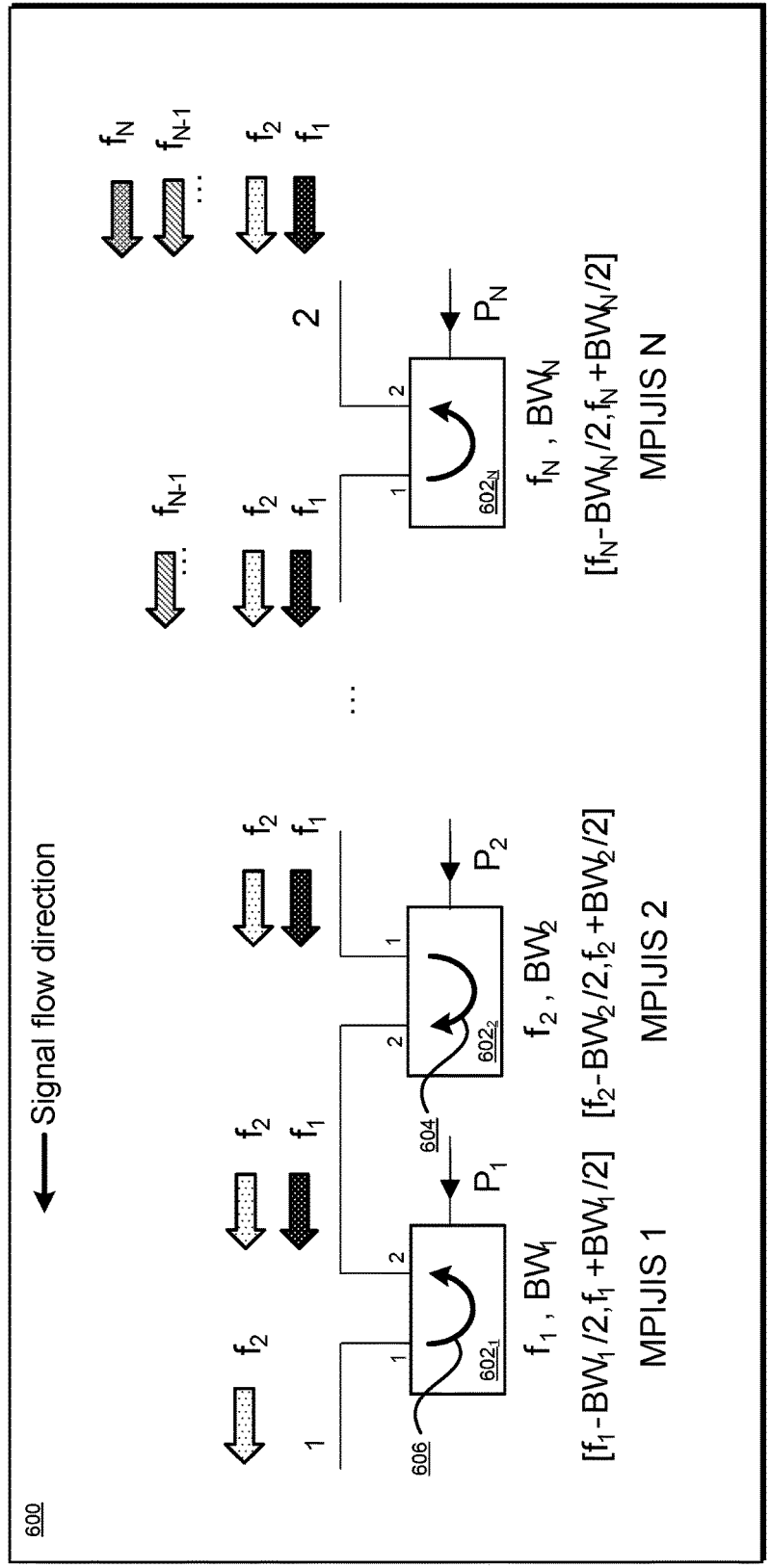
FIG. 7 depicts a block diagram of an example selective propagation operation of a cascading MPIJIS in accordance with an illustrative embodiment.
Figure 8:
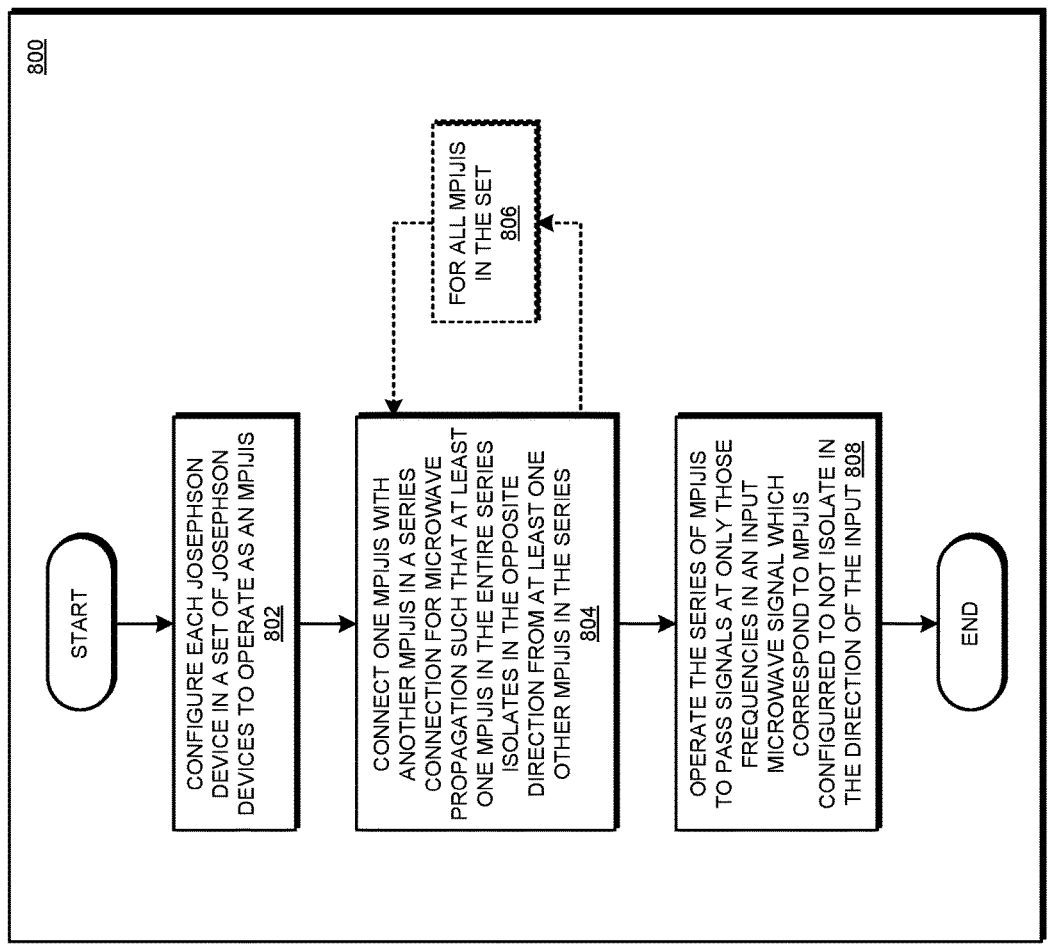
FIG. 8 depicts a flowchart of an example process for propagation or isolation signals of some but not all frequencies in a frequency-multiplexed microwave signal using cascading multi-path interferometric Josephson isolators with nonoverlapping bandwidths in accordance with an illustrative embodiment.

FIGS. 3-5 describe a cascading configuration and a manner of operating the same, to propagate or isolate all frequency-multiplexed microwave signals having different frequencies. FIGS. 6-8 describe a different cascading configuration and a manner of operating the same, to selectively propagate or isolate some but not all frequency-multiplexed microwave signals.

With reference to FIG. 3, this figure depicts a block diagram of an example configuration and a non-isolating operation of a cascading MPIJIS in accordance with an illustrative embodiment. This cascading configuration propagates all frequency-multiplexed microwave signals having different frequencies. Each of MPIJIS devices $302_1$, $302_2$ . . . $302_N$ is an MPIJIS according to symbol 110. MPIJIS devices $302_1$-$302_N$ represent N MPIJIS devices (N>1) that are cascaded in configuration 300.

A cascading of MPIJIS devices is a series connection of MPIJIS devices whereby port 1 of the first MPIJIS ($302_1$) is coupled to an external circuit for receiving a microwave signal input (assuming that cascade 300 is operating in the direction of non-isolation as shown by the rounded arrows); port 2 of the first MPIJIS ($302_1$) is coupled to port 1 of the next MPIJIS ($302_2$); port 2 of the next MPIJIS ($302_2$) is coupled to port 1 of the next MPIJIS, and so on, until port 2 of N−1th MPIJIS is coupled to port 1 of the last MPIJIS ($302_N$), and port 2 of the last MPIJIS ($302_N$) is coupled to an external circuit to which cascade 300 provides a microwave signal output.

Each MPIJIS $302_1$-$302_N$ is configured in cascade 300 such that each MPIJIS $302_1$-$302_N$ passes an input signal in the same direction (direction of the rounded arrows in their respective symbols, which are all facing the same direction), and isolates in the same opposite direction (opposite of the direction of the rounded arrows in their respective symbols).

Furthermore, each MPIJIS $302_1$-$302_N$ in cascade 300 operates in a substantially nonoverlapping frequency band. For example, MPIJIS $302_1$ operates in a narrow bandwidth ($BW_1$) where a center frequency is $f_1$, i.e., half of $BW_1$ is below $f_1$ and including $f_1$ and half of $BW_1$ is above $f_1$. Therefore, $BW_1$ is [$f_1$−$BW_1$/2 to $f_1$+$BW_1$/2]. Similarly, MPIJIS $302_2$ has a center frequency $f_2$, and $BW_2$ of [$f_2$−$BW_2$/2 to $f_2$+$BW_2$/2]. And the MPIJIS devices in the set are defined in a similar manner until MPIJIS $302_N$ has a center frequency $f_N$, and $BW_N$ Of [$f_N$−$BW_N$/2 to $f_N$+$BW_N$/2]. $BW_1$ . . . $BW_N$ do not overlap, or overlap by an insignificant amount.

An MPIJIS in cascading configuration 300 operates only on signals in the bandwidth of frequencies for which it is tuned. In other words, an MPIJIS will isolate (flowing in the direction from port 2 to port 1) signals of those frequencies that fall within its operating bandwidth. The MPIJIS will pass in both directions, in a substantially loss-less manner, signals of frequencies outside of the operating bandwidth of that MPIJIS.

For example, MPIJIS $302_2$ will only isolate a signal at a frequency (substantially prevent the signal from passing through MPIJIS $302_2$) in $BW_2$ if flowing from port 2 of MPIJIS $302_2$ to port 1 of MPIJIS $302_2$, but will allow signals at frequencies in $BW_1$, $BW_3$, $BW_4$ . . . $BW_N$ to pass in a substantially loss-less manner in the isolating direction.

MPIJIS $302_2$ will allow signals at frequencies not only in $BW_2$ but also in $BW_1$, $BW_3$, $BW_4$ ... $BW_N$ to pass in a substantially loss-less manner in the non-isolating direction. Each MPIJIS $302_1$ ... $302_N$ in configuration 300 operates relative to its respective operating bandwidth and frequencies outside its operating bandwidth in a similar manner.

In configuration 300, MPIJIS $302_1$ allows a signal at frequency $f_1$ to pass in the non-isolating direction because MPIJIS $302_1$ passes the signals at frequencies in $BW_1$ and $f_1$ is in $BW_1$. MPIJIS $302_1$ allows frequencies $f_2$ ... $f_N$ to pass because those frequencies are outside $BW_1$. Similarly, MPIJIS $302_2$ allows the signal at frequency $f_2$ to pass in the non-isolating direction because MPIJIS $302_2$ passes the signals at frequencies in $BW_2$ and $f_2$ is in $BW_2$. MPIJIS $302_2$ allows the signals at frequencies $f_1$, $f_i$ ... $f_N$ to pass because those frequencies are outside $BW_2$. MPIJIS $302_N$ allows the signal at frequency $f_N$ to pass in the non-isolating direction because MPIJIS $302_N$ passes the signals at frequencies in $BW_N$ and $f_N$ is in $BW_N$. MPIJIS $302_N$ allows signals at frequencies $f_1$ ... $f_{N-1}$ to pass because those frequencies are outside $BW_N$. Thus, as depicted in this figure, an input signal that multiplexes signals at frequencies $f_1$, $f_2$ ... $f_N$ passes through cascade 300 in a substantially loss-less manner (zero or negligible attenuation) in the non-isolating direction of the participating MPIJIS devices $302_1$ ... $302_N$.

Configuration 300 is represented compactly as cascading MPIJIS 302. The effective bandwidth over which cascading MPIJIS 302 can operate is therefore, $$BW=\{[f_1-BW_1/2 \text{ to } f_1+BW_1/2],[f_2-BW_2/2 \text{ to } f_2+BW_2/2], \ldots [f_N-BW_N/2 \text{ to } f_N+BW_N/2]\}$$

The pass-through bandwidth BW of cascading MPIJIS 302 is greater than the pass-through bandwidth of any single MPIJIS in configuration 300. Thus, cascading MPIJIS 302 is operable over a broader bandwidth than the operating bandwidth of a single MPIJIS. The non-isolating operation of cascading MPIJIS 302 shows multiplexed signals at frequencies $f_1$, $f_2$ ... $f_N$ passing through from port 1 of cascading MPIJIS 302 (which is port 1 of the first MPIJIS in the cascade) to port 2 of cascading MPIJIS 302 (which is port 2 of the last MPIJIS in the cascade).

With reference to FIG. 4, this figure depicts a block diagram of an example isolating operation of a cascading MPIJIS in accordance with an illustrative embodiment. This cascading configuration isolates all frequency-multiplexed microwave signals that are within the bandwidth of any of the cascaded MPIJIS devices. Cascade 300, MPIJIS devices $302_1$, $302_2$ ... $302_N$, and cascading MPIJIS 302 are the same as in FIG. 3. Frequency $f_1$ is in $BW_1$ of MPIJIS $302_1$, $f_2$ is in $BW_2$ of MPIJIS $302_2$ ... $f_N$ is in $BW_N$ of MPIJIS $302_N$.

In the isolating operation of this figure, signals at frequencies $f_1$, $f_2$ ... $f_N$ are input at port 2 of cascade 300, to wit, at port 2 of the last MPIJIS ($302_N$) in cascade 300. In cascade 300, MPIJIS $302_N$ blocks the signal at frequency $f_N$ allowing signals at frequencies $f_{N-1}$ ... $f_1$ which are out of bandwidth $BW_N$ to pass in the isolating direction because MPIJIS $302_N$ blocks the signal frequencies only in $BW_N$ and $f_N$ is in $BW_N$. Operating in this manner, MPIJIS $302_N$ has effectively filtered out the signal at frequency $f_N$ from the multiplexed input microwave signals. Similarly, N−$1^{th}$ MPIJIS blocks signals of frequency $f_{N-1}$, allowing signals of frequencies $f_{N-2}$ ... $f_1$ which are out of bandwidth $BW_{N-1}$ to pass in the isolating direction. MPIJIS $302_N$ has already filtered out the signal at frequency $f_N$, now the N−$1^{th}$ MPIJIS has filtered out the signal at $f_{N-1}$.

Operating in this manner, each MPIJIS filters out or blocks the signal of that frequency which is within the bandwidth of that MPIJIS. Thus, MPIJIS $302_2$ effectively filters out signal at frequency $f_2$ and MPIJIS $302_1$ effectively filters out signal at frequency $f_1$ from the multiplexed input microwave signal, leaving no signals in the multiplexed input signals at frequencies $f_1$ ... $f_N$ arriving at port 1 of cascade 300. Thus, as depicted in this figure, frequency-multiplexed input signals at frequencies $f_1$, $f_2$ ... $f_N$ are substantially isolated (complete isolation or isolation with negligible pass-through) by cascade 300 in the isolating direction of the participating MPIJIS devices $302_1$ ... $302_N$.

Cascading MPIJIS 302 according to configuration 300 has the effective bandwidth over which cascading MPIJIS 302 can isolate as, $$BW=\{[f_1-BW_1/2 \text{ to } f_1+BW_1/2],[f_2-BW_2/2 \text{ to } f_2+BW_2/2], \ldots [f_N-BW_N/2 \text{ to } f_N+BW_N/2]\}$$

Again, the isolation bandwidth BW of cascading MPIJIS 302 is greater than the isolation bandwidth of any single MPIJIS in configuration 300. Thus, cascading MPIJIS 302 is operable to isolate frequency-multiplexed signals that span a broader bandwidth than the operating bandwidth of a single MPIJIS. The isolating operation of cascading MPIJIS 302 shows frequency-multiplexed signals at frequencies $f_1$, $f_2$ ... $f_N$ isolated from port 2 of cascading MPIJIS 302 (which is port 2 of the last MPIJIS in the cascade) to port 1 of cascading MPIJIS 302 (which is port 1 of the first MPIJIS in the cascade).

With reference to FIG. 5, this figure depicts a flowchart of an example process for propagation or isolation of all signals at frequencies within a frequency multiplexed microwave input using cascading multi-path interferometric Josephson isolators with nonoverlapping bandwidths in accordance with an illustrative embodiment. Process 500 can be implemented using cascading MPIJIS 302 for the operations described in FIGS. 3 and 4.

Each Josephson device in a set of Josephson devices is configured as an MPIJIS (block 502). The MPIJIS devices are connected in a cascade by connecting one MPIJIS with another MPIJIS in a series connection (block 504). The MPIJIS devices in the series connection are configured such that all MPIJIS devices in the series isolate a microwave signal of their respective frequency in the opposite direction of signal flow in the cascade. The cascade is built by adding all MPIJIS devices from the set in series in this manner (block 506).

The cascade operates to pass (as in FIG. 3) or isolate (as in FIG. 4) an input microwave signal where the signal is at a frequency corresponding to the bandwidth of any of the MPIJIS devices in the series (block 508).

FIGS. 6-8 now describe a different cascading configuration and a manner of operating the same, to selectively propagate or isolate the signals at some but not all in frequency-multiplexed microwave signals.

With reference to FIG. 6, this figure depicts a block diagram of an example configuration and a selective isolation operation of a cascading MPIJIS in accordance with an illustrative embodiment. This cascading configuration isolates only the signals at some frequencies in frequency-multiplexed microwave signals. Each of MPIJIS devices $602_1$, $602_2$ ... $602_N$ is an MPIJIS according to symbol 110. MPIJIS devices $602_1$-$602_N$ represent N MPIJIS devices (N>1) that are cascaded in configuration 600.

A cascading of MPIJIS devices is a series connection of MPIJIS devices whereby an MPIJIS in the series can be connected such that a direction of non-isolation (propagation) through the MPIJIS matches a direction of the signal flow through the series, or such that a direction of isolation (blocking) through the MPIJIS matches the direction of the signal flow through the series. For example, non-limiting example cascade 600 is formed by coupling port 1 of the first MPIJIS ($602_1$) to an external circuit for receiving a frequency multiplexed microwave signal input, in which case the direction of propagation through MPIJIS $602_1$ matches the signal flow direction in FIG. 6. Port 2 of the first MPIJIS ($602_1$) is coupled to port 2 of the next MPIJIS ($602_2$), in which case, the direction of isolation through MPIJIS $602_2$ matches the signal flow direction in FIG. 6. Port 1 of MPIJIS $602_2$ is coupled to port 1 of the next MPIJIS, in which case the direction of propagation through the next MPIJIS matches the signal flow direction in FIG. 6; and so on, until port 2 of N-$1^{th}$ MPIJIS is coupled to port 1 of the last MPIJIS ($602_N$), and port 2 of the last MPIJIS ($602_N$) is coupled to an external circuit to which cascade 600 provides a microwave signal output.

Without implying any limitation, and only for the clarity of the description, example configuration 600 is depicted with only one MPIJIS ($602_2$) connected in reverse (direction of propagation of the MPIJIS is opposite of the signal flow direction through the cascade). Any number of MPIJIS devices can be coupled in series with their respective directions of propagation aligned with the direction of the signal flow, and any number of MPIJIS devices can be coupled in series with their respective directions of propagation opposite with the direction of the signal flow, to construct a cascade that selectively filters signals at certain frequencies. The cascade constructed in this manner filters out (blocks or isolates) those signals whose frequencies correspond to the MPIJIS devices whose directions of propagation are opposite the direction of the signal flow, and the cascade constructed in this manner passes (propagates) those signals whose frequencies which correspond to those MPIJIS devices whose directions of propagation are aligned with the direction of the signal flow.

Thus, depending upon which group of frequency-multiplexed microwave signals have to be propagated, one or more MPIJIS $602_1$-$602_N$ having bands corresponding to those frequencies are configured in cascade 600 such that some MPIJIS $602_1$-$602_N$ pass signals at these frequencies in an input signal in the direction of the signal flow (direction of the rounded arrows in their respective symbols, which are all facing the same direction as the direction of signal flow). And depending upon which group of frequency-multiplexed microwave signals have to be isolated, one or more MPIJIS $602_1$-$602_N$ having bands corresponding to those frequencies are configured in cascade 600 such that those MPIJIS isolate in the signal flow direction (the direction of the rounded arrows in their respective symbols is opposite of signal flow direction).

Furthermore, each MPIJIS $602_1$-$602_N$ in cascade 600 operates in a substantially nonoverlapping frequency band. For example, MPIJIS $602_1$ operates in a relatively narrow bandwidth ($BW_1$) where a center frequency is $f_1$, i.e., half of $BW_1$ is below $f_1$ and includes $f_1$ and half of $BW_1$ is above $f_1$. Therefore, $BW_1$ is [$f_1$-$BW_1/2$ to $f_1$+$BW_1/2$]. Similarly, MPIJIS $602_2$ has a center frequency $f_2$, and $BW_2$ of [$f_2$-$BW_2/2$ to $f_2$+$BW_2/2$]. And the MPIJIS devices in the set are defined in a similar manner until the (N-1)$^{th}$ MPIJIS has a center frequency $f_{N-1}$, and $BW_{N-1}$ of [$f_{N-1}$-$BW_{N-1}/2$ to $f_{N-1}$+$BW_{N-1}/2$]; and MPIJIS $602_N$ has a center frequency $f_N$, and $BW_N$ of [$f_N$-$BW_N/2$ to $f_N$+$BW_N/2$]. $BW_1$ . . . $BW_N$ do not overlap, or overlap only by an insignificant amount.

An MPIJIS in cascading configuration 600 isolates only signals which lie within the bandwidth of frequencies for which it is tuned. In other words, an MPIJIS will isolate (flowing in the direction from port 2 to port 1 of that MPIJIS) those signals whose frequencies that fall within its operating bandwidth. The MPIJIS will pass in both directions, in a substantially loss-less manner, signals of frequencies outside of the operating bandwidth of that MPIJIS.

For example, MPIJIS $602_2$ will only isolate a signal at frequency (substantially prevent or significantly attenuate the signal at that frequency from passing through MPIJIS $602_2$) in $BW_2$ if flowing from port 2 of MPIJIS $602_2$ to port 1 of MPIJIS $602_2$, but will allow signals at frequencies in $BW_1$, $BW_3$, $BW_4$ . . . $BW_{N-1}$, $BW_N$ to pass in a substantially loss-less manner in the isolating direction. MPIJIS $602_2$ will allow signals of frequencies not only in $BW_2$ but also in $BW_1$, $BW_3$, $BW_4$ . . . $BW_{N-1}$, $BW_N$ to pass in a substantially loss-less manner in the non-isolating direction (port 1 to port 2). Each MPIJIS $602_1$ . . . $602_N$ in configuration 600 operates relative to its respective operating bandwidth and frequencies outside its operating bandwidth in a similar manner.

In configuration 600, MPIJIS $602_1$ allows a signal of frequency $f_1$ to pass in the non-isolating direction because MPIJIS $602_1$ passes the signals at frequencies in $BW_1$ and $f_1$ is in $BW_1$. MPIJIS $602_1$ allows signals of frequencies $f_2$ . . . $f_N$ to pass because those frequencies are outside $BW_1$. However, MPIJIS $602_2$ is configured in cascade 600 in an isolating direction (direction of arrow 604 is reverse of direction of arrow 606), and therefore isolates the signal at frequency $f_2$ because MPIJIS $602_2$ isolates the signals at frequencies in $BW_2$ from port 2 to port 1, and $f_2$ is in $BW_2$. MPIJIS $602_2$ allows signals of frequencies $f_1$, $f_i$ . . . $f_{N-1}$, $f_N$ to pass because those frequencies are outside $BW_2$. Assuming that all other MPIJIS devices in cascade 600 are configured in the propagating direction, the multiplexed signal with $f_1$, $f_3$ . . . $f_i$ . . . $f_{N-1}$, $f_N$ (no $f_2$) reaches MPIJIS $602_N$. MPIJIS $602_N$ allows the signal at frequency $f_N$ to pass in the non-isolating direction because MPIJIS $602_N$ passes the signals of frequencies in $BW_N$ and $f_N$ is in $BW_N$. MPIJIS $602_N$ allows the signals at frequencies $f_1$, $f_3$ . . . $f_i$ . . . $f_{N-1}$ to pass because those frequencies are outside $BW_N$. Thus, as depicted in this figure, input signals at frequencies $f_1$, $f_2$ . . . $f_N$ pass through cascade 600 in a substantially loss-less manner (zero or negligible attenuation) in selected frequencies $f_1$, $f_3$ . . . $f_i$ . . . $f_N$ with the signal frequency at $f_2$ having been selectively isolated from the input signals.

To generalize, if input signals (at port 1 of the cascade) have frequencies $f_A$, $f_B$, $f_C$, $f_D$, $f_E$, $f_F$, $f_G$, and $f_H$, MPIJIS A (isolates signals of $f_A$), C (isolates signals of $f_C$), E (isolates signals of $f_E$), G (isolates signals of $f_G$) are oriented in the cascade such that they propagate in the signals flow direction, and MPIJIS B (isolates signals of $f_B$), D (isolates signals of $f_D$), F (isolates signals of $f_F$), and H (isolates signals of $f_H$) are oriented in the cascade such that they isolate in the signal flow direction, then the output signal (at port 2 of the cascade) will contain only signals of $f_A$, $f_C$, $f_E$, and $f_G$.

The effective bandwidth over which cascade 600 can selectively isolate signals of certain frequencies is therefore, $$BW=\{[f_1-BW_1/2 \text{ to } f_1+BW_1/2],[f_2-BW_2/2 \text{ to } f_2+BW_2/2], \ldots [f_N-BW_N/2 \text{ to } f_N+BW_N/2]\}$$

The pass-through or isolation bandwidth BW of cascade 600 is greater than the pass-through or isolation bandwidth of any single MPIJIS in configuration 600. Thus, cascade 600 is operable with a frequency multiplexed signal that spans a broader bandwidth than the operating bandwidth of a single MPIJIS.

With reference to FIG. 7, this figure depicts a block diagram of an example selective propagation operation of a cascading MPIJIS in accordance with an illustrative embodiment. This cascading configuration selectively propagates some but not all frequency-multiplexed microwave signals. Cascade 600 and MPIJIS devices $602_1, 602_2 \ldots 602_N$ are the same as in FIG. 6. Frequency $f_1$ is in $BW_1$ of MPIJIS $602_1$, $f_2$ is in $BW_2$ of MPIJIS $602_2 \ldots f_{N-1}$ is in $BW_{N-1}$ of $(N-1)^{th}$ to MPIJIS, and $f_N$ is in $BW_N$ of MPIJIS $602_N$.

In the selective propagating operation of this figure, signals at frequencies $f_1, f_2 \ldots f_N$ are input in the shown signal flow direction at port 2 of cascade 600, to wit, at port 2 of the last MPIJIS ($602_N$) in cascade 600. In this operation of cascade 600, MPIJIS $602_N$ blocks signals at frequency $f_N$, allowing signals at frequencies $f_{N-1} \ldots f_1$ which are out of bandwidth $BW_N$ to pass in the isolating direction because MPIJIS $602_N$ blocks the signals at frequencies only in $BW_N$ and $f_N$ is in $BW_N$. Operating in this manner, MPIJIS $602_N$ has effectively filtered out the signal at frequency $f_N$ from the multiplexed input microwave signal. Similarly, N-1$^{th}$ MPIJIS blocks the signal at frequency $f_{N-1}$ allowing signals at frequencies $f_{N-2} \ldots f_1$ which are out of bandwidth $BW_{N-1}$ to pass in the isolating direction. MPIJIS $602_N$ has already filtered out the signal at frequency $f_N$, now the N-1$^{th}$ MPIJIS has filtered out the signal at $f_{N-2}$.

Operating in this manner, depending on the orientation of the MPIJDA in cascade 600, each MPIJIS filters out or blocks a signal of that frequency which is within the bandwidth of that MPIJIS. Because MPIJIS $602_2$ is propagating in the direction of the signal flow, MPIJIS $602_2$ propagates the signal at frequency $f_2$. MPIJIS $602_2$ propagates the signal at $f_1$ for being out of $BW_2$. MPIJIS $602_1$ effectively filters out the signal at frequency $f_1$ from the remaining frequency-multiplexed input microwave signals, and propagates $f_2$ for being out of $BW_1$. Thus, the output signal at port 1 of cascade 600, to wit, at port 1 of MPIJIS $602_1$, is only the signal at frequency $f_2$ which has been selectively propagated from the frequency-multiplexed input signals at frequencies $f_1 \ldots f_N$. Thus, as depicted in this figure, input signals at frequencies $f_1, f_2 \ldots f_N$ is selectively propagated (only some frequencies pass-through) by cascade 600 in the selective propagating direction of the participating MPIJIS devices $602_1 \ldots 602_N$.

Cascade 600 has the effective bandwidth over which cascading MPIJIS 602 can selectively propagate as, $$BW=\{[f_1-BW_1/2 \text{ to } f_1+BW_1/2],[f_2-BW_2/2 \text{ to } f_2+BW_2/2], \ldots [f_N-BW_N/2 \text{ to } f_N+BW_N/2]\}$$

Again, the selective propagation bandwidth BW of cascade 600 is greater than the propagation bandwidth of any single MPIJIS in configuration 600. Thus, cascade 600 is operable to selectively propagate signals of some frequencies from a frequency multiplexed signal that spans a broader bandwidth than the operating bandwidth of a single MPIJIS.

Again, without implying any limitation, and only for the clarity of the description, example configuration 600 is depicted with only one MPIJIS ($602_2$) connected with a direction of propagation that is aligned with the signal flow direction through the cascade. Any number of MPIJIS devices can be coupled in series with their respective directions of propagation aligned with the direction of the signal flow, and any number of MPIJIS devices can be coupled in series with their respective directions of propagation opposite the direction of the signal flow, to construct a cascade that selectively propagates signals at certain frequencies. The cascade constructed in this manner filters out (blocks or isolates) those signals at frequencies which correspond to the MPIJIS devices whose directions of propagation are opposite the direction of the signal flow, and passes (propagates) signals of those frequencies which correspond to those MPIJIS devices whose directions of propagation are aligned with the direction of the signal flow.

To generalize, if the input signal (at port 2 of the cascade) has signals of frequencies $f_A, f_B, f_C, f_D, f_E, f_F, f_G,$ and $f_H$, MPIJIS A (isolates signals of $f_A$), C (isolates signals of $f_C$), E (isolates signals of $f_E$), G (isolates signals of $f_G$) are oriented in the cascade such that they propagate in the signal flow direction, and MPIJIS B (isolates signals of $f_B$), D (isolates signals of $f_D$), F (isolates signals of $f_F$), and H (isolates signals of $f_H$) are oriented in the cascade such that they isolate in the signal flow direction, then the output signal (at port 1 of the cascade) will contain only signals of $f_A, f_C, f_E,$ and $f_G$.

With reference to FIG. 8, this figure depicts a flowchart of an example process for propagation or isolation signals of some but not all frequencies in a frequency-multiplexed microwave signal using cascading multi-path interferometric Josephson isolators with nonoverlapping bandwidths in accordance with an illustrative embodiment. Process 800 can be implemented using cascade 600 for the operations described in FIGS. 6 and 7.

Each Josephson device in a set of Josephson devices is configured as an MPIJIS (block 802). The MPIJIS devices are connected in a cascade by connecting one MPIJIS with another MPIJIS in a series connection (block 804). The MPIJIS devices in the series connection are configured such that at least some MPIJIS devices (reversed MPIJIS devices) in the series isolate a microwave signal of their respective frequency in the direction of signal flow in the cascade. The cascade is built by adding all MPIJIS devices from the set in series in this manner (block 806).

The cascade operates to selectively isolate (as in FIG. 6) or selectively propagate (as in FIG. 7) a frequency multiplexed input microwave signal where the signal contains a signal at frequency corresponding to any of the reversed MPIJIS devices in the series (block 808).

The circuit elements of the MPIJIS device and connections thereto can be made of superconducting material. The respective resonators and transmission/feed/pump lines can be made of superconducting materials. The hybrid couplers can be made of superconducting materials. Examples of superconducting materials (at low temperatures, such as about 10-100 millikelvin (mK), or about 4 K) include Niobium, Aluminum, Tantalum, etc. For example, the Josephson junctions are made of superconducting material, and their tunnel junctions can be made of a thin tunnel barrier, such as an aluminum oxide. The capacitors can be made of superconducting material separated by low-loss dielectric material. The transmission lines (i.e., wires) connecting the various elements can be made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A cascading microwave isolator (cascade) comprising:
    a set of Josephson devices, each Josephson device in the set having a corresponding operating bandwidth of microwave frequencies, wherein different operating bandwidths have different corresponding center frequencies; and
    a series coupling between first Josephson device from the set and an $n^{th}$ Josephson device from the set, wherein the series coupling causes the first Josephson device to isolate a signal at a first frequency from a frequency multiplexed microwave signal (multiplexed signal) in a first signal flow direction through the series coupling and the $n^{th}$ Josephson device to isolate a signal at an $n^{th}$ frequency from the multiplexed signal in the first signal flow direction through the series.

2. The cascade of claim 1, further comprising:
    an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device isolates a signal at an $(n-1)^{th}$ frequency from the multiplexed signal in the first signal flow direction.

3. The cascade of claim 1,
    wherein the series coupling causes the first Josephson device to propagate the signal at an $n^{th}$ frequency from the multiplexed signal in the first signal flow direction through the series coupling and the $n^{th}$ Josephson device to propagate the signal at the first frequency in the first signal flow direction through the series.

4. The cascade of claim 1,
    wherein the series coupling causes the first Josephson device and the $n^{th}$ Josephson device to propagate all signals at frequencies from the multiplexed signal in a second signal flow direction through the series coupling, wherein the second signal flow direction is opposite of the first signal flow direction, and wherein the first signal flow direction is a direction of isolation of the first Josephson device and the $n^{th}$ Josephson device.

5. The cascade of claim 1,
    wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

6. The cascade of claim 5,
    wherein a total isolation bandwidth of the cascade comprises the first operating bandwidth and the $n^{th}$ operating bandwidth.

7. The cascade of claim 1, wherein the first Josephson device in the set of Josephson devices is an MPIJIS, comprises:
    a first nondegenerate microwave mixer device (first mixer);
    a second nondegenerate microwave mixer device (second mixer);
    a first input/output (I/O) port coupled to an input port of the first mixer and an input port of the second mixer; and
    a second I/O port coupled to the input port of the first mixer and the input port of the second mixer, wherein the signal of the first frequency communicated between the first I/O port and the second I/O port is transmitted while propagating in a first direction between the first I/O port to the second I/O port through the first mixer and the second mixer and is blocked while propagating in a second direction between the second I/O port to the first I/O through the first mixer and the second mixer, and wherein the first frequency is in a first operating bandwidth of the first Josephson device.

8. The cascade of claim 7, further comprising:
a first microwave pump injecting a first microwave drive into the first mixer at a pump frequency and a first pump phase, wherein the first microwave pump is configured to cause the first mixer to operate at a 50:50 beamsplitting working point; and
a second microwave pump injecting a second microwave drive into the second mixer at the pump frequency and a second pump phase wherein the second microwave pump is configured to cause the second mixer to operate at the 50:50 beamsplitting working point, and wherein a phase difference between the first pump phase and the second pump phase determines an isolation direction.

9. The cascade of claim 7, wherein the first mixer and the second mixer are each a nondegenerate three-wave mixer.

10. The cascade of claim 7, wherein the first mixer and the second mixer are each a Josephson parametric converter (JPC), and wherein the first mixer and the second mixer are nominally identical.

11. A method to form a cascading microwave isolator (cascade), the method comprising:
fabricating a set of Josephson devices, each Josephson device in the set having a corresponding operating bandwidth of microwave frequencies, wherein different operating bandwidths have different corresponding center frequencies; and
forming a series coupling between first Josephson device from the set and an $n^{th}$ Josephson device from the set, wherein the series coupling causes the first Josephson device to isolate a signal at a first frequency from a frequency multiplexed microwave signal (multiplexed signal) in a first signal flow direction through the series coupling and the $n^{th}$ Josephson device to isolate a signal at an $n^{th}$ frequency from the multiplexed signal in the first signal flow direction through the series.

12. A superconductor fabrication system which when operated to fabricate a cascading microwave isolator (cascade) performing operations comprising:
fabricating a set of Josephson devices, each Josephson device in the set having a corresponding operating bandwidth of microwave frequencies, wherein different operating bandwidths have different corresponding center frequencies; and
forming a series coupling between first Josephson device from the set and an $n^{th}$ Josephson device from the set, wherein the series coupling causes the first Josephson device to isolate a signal at a first frequency from a frequency multiplexed microwave signal (multiplexed signal) in a first signal flow direction through the series coupling and the $n^{th}$ Josephson device to isolate a signal at an $n^{th}$ frequency from the multiplexed signal in the first signal flow direction through the series.

13. The superconductor fabrication system of claim 12, further comprising:
an $(n-1)^{th}$ Josephson device from the set in the series coupling, wherein n is greater than 1, wherein the $(n-1)^{th}$ Josephson device is included the series coupling between the first Josephson device and the $n^{th}$ Josephson device, and wherein the $(n-1)^{th}$ Josephson device isolates a signal at an $(n-1)^{th}$ frequency from the multiplexed signal in the first signal flow direction.

14. The superconductor fabrication system of claim 12, wherein the series coupling causes the first Josephson device to propagate the signal at an $n^{th}$ frequency from the multiplexed signal in the first signal flow direction through the series coupling and the $n^{th}$ Josephson device to propagate the signal at the first frequency in the first signal flow direction through the series.

15. The superconductor fabrication system of claim 12, wherein the series coupling causes the first Josephson device and the $n^{th}$ Josephson device to propagate all signals at frequencies from the multiplexed signal in a second signal flow direction through the series coupling, wherein the second signal flow direction is opposite of the first signal flow direction, and wherein the first signal flow direction is a direction of isolation of the first Josephson device and the $n^{th}$ Josephson device.

16. The superconductor fabrication system of claim 12, wherein a first operating bandwidth of microwave frequencies corresponding to the first Josephson device is nonoverlapping for at least some frequencies with an $n^{th}$ operating bandwidth of microwave frequencies corresponding to the $n^{th}$ Josephson device.

17. The superconductor fabrication system of claim 16, wherein a total isolation bandwidth of the cascade comprises the first operating bandwidth and the $n^{th}$ operating bandwidth.

18. The superconductor fabrication system of claim 12, wherein the first Josephson device in the set of Josephson devices is an MPIJIS, comprises:
a first nondegenerate microwave mixer device (first mixer);
a second nondegenerate microwave mixer device (second mixer);
a first input/output (I/O) port coupled to an input port of the first mixer and an input port of the second mixer; and
a second I/O port coupled to the input port of the first mixer and the input port of the second mixer, wherein the signal of the first frequency communicated between the first I/O port and the second I/O port is transmitted while propagating in a first direction between the first I/O port to the second I/O port through the first mixer and the second mixer and is blocked while propagating in a second direction between the second I/O port to the first I/O through the first mixer and the second mixer, and wherein the first frequency is in a first operating bandwidth of the first Josephson device.

19. The superconductor fabrication system of claim 18, further comprising:
a first microwave pump injecting a first microwave drive into the first mixer at a pump frequency and a first pump phase, wherein the first microwave pump is configured to cause the first mixer to operate at a 50:50 beamsplitting working point; and
a second microwave pump injecting a second microwave drive into the second mixer at the pump frequency and a second pump phase wherein the second microwave pump is configured to cause the second mixer to operate at the 50:50 beamsplitting working point, and wherein a phase difference between the first pump phase and the second pump phase determines an isolation direction.

20. The superconductor fabrication system of claim 18, wherein the first mixer and the second mixer are each a nondegenerate three-wave mixer.

* * * * *